July 8, 1969 H. G. DILL 3,454,844

FIELD EFFECT DEVICE WITH OVERLAPPING INSULATED GATES

Filed July 1, 1966 Sheet 1 of 2

Hans G. Dill,
INVENTOR.
BY.
W. H. MacAllister Jr
ATTORNEY.

FIELD EFFECT DEVICE WITH OVERLAPPING INSULATED GATES 3,454,844
Patented July 8, 1969

3,454,844

FIELD EFFECT DEVICE WITH OVERLAPPING INSULATED GATES

Hans G. Dill, Costa Mesa, Calif., assignor to Hughes Aircraft Company, Culver City, Calif., a corporation of Delaware Filed July 1, 1966, Ser. No. 562,971
Int. Cl. H01l 5/06
U.S. Cl. 317—235 8 Claims

ABSTRACT OF THE DISCLOSURE

A field effect transistor having two overlapping insulated gates, the first gate extending only partially over the channel region with the second gate superimposed over the first gate and completely covering the channel region.

This invention relates to transistor devices and especially to transistor devices in which the conductivity of a relatively shallow region in a semiconductor body is modulated by means of an electric field. More particularly the invention relates to transistor structures of the type known as insulated gate field-effect transistors.

Operation of transistors of the type to which the present invention appertains is based upon the control of the conductivity of a conduction channel in semiconductor body which channel is induced by an electric field established therein by an insulated control gate as well as by surface charges which may be ionic in nature. The transistors of the present invention are usually formed by deposition and diffusion techniques. In the transistors of the present invention majority charge carries (electrons or holes) flow through the solid state semi-conductor material from an electrode usually called the "source." The conductive path for these charge carriers, hereinafter called the "channel," is induced by an electric field and surface charges and occurs at surface and near surface regions of the semi-conductor body. In the absence of this induced channel the flow of such charge carriers cannot occur. The charge carriers move or flow in the induced channel toward a second electrode called the "drain." The field effect in the semi-conductor is established by a control or "gate" electrode and by this gate the conductivity of the channel and hence the electron or hole current reaching the drain can be varied. This control electrode or "gate" is insulated from the semi-conductor material to prevent the majority carriers from flowing to it. Normally these devices are operated in a drain-voltage region where the drain current saturates or reaches a maximum, nearly constant value because the channel is pinched-off or terminated very close to the drain region and acts as a current generator, the current being only a function of the gate voltage and not of the drain voltage. Thus, these devices basically exhibit the useful drain voltage-drain current characteristic similar to a vacuum pentode.

Such devices are known in the art and the structure and operation thereof have been amply described, especially by Hofstein and Heiman in an article entitled, "Silicon Insulated-Gate Field-Effect Transistor," published in the September 1962 proceedings of the I.E.E.E. commencing on page 1190. In one arrangement the field-effect transistors have the source and drain electrodes disposed side-by-side with the gate arranged over the space between the source and drain and separated therefrom by an insulator. A typical prior art arrangement is shown in FIGURE 13 hereof as well as in the above-mentioned article by Hofstein and Heiman. The gate electrode is insulated from the semi-conductor material so that the gate electrode will not itself act as a source or drain electrode and may yet exert its control by field effect in the space between the source and drain electrodes.

In United States Patent No. 3,191,061 to Weimer an insulated gate field effect apparatus is shown in which two such devices are disposed on a common semiconductor. In this arrangement, while two gates are shown, the gates are not in overlopping relationship with respect to each other. Thus, gate 1 of one device becomes drain 2 for the second device while drain 1 in one device becomes gate 2 in the second device.

It will be appreciated from the prior art field effect devices that the usual arrangements is for the gate which is generally of metal to overlap the source and drain electrodes or portions of the device. This permits the channel region between the source and drain to be completely modulated by the gate. It also reduces somewhat the mask alignment since the channel region can be made small without the necessity of trying to fit an extremely narrow gate precisely over the channel region. Such prior art field effect devices, however, the fact that the gate electrode overlaps the drain electrode results in a substantial degree to the introduction of an undesirable feedback capacitance usually referred to as Miller feedback capacitance. In addition, the useful drain potential of these devices is limited by a high field breakdown on the drain by avalanche multiplication due to the field between the gate and the drain in the pinch-off region. This means that the breakdown potential of the drain is undesirably low.

Solutions to these problems have been sought by utilizing a "half gate" or an offset gate arrangement disposed away from the drain. In such approaches, the gate overlaps a portion of the source electrode and extends only partially, halfway for example, across the channel region. It will be appreciated that such a solution suffers a possible reduction in the gate coverage of the channel region, portions of which may now be unmodulated. On the other hand, the half-gate arrangement, shown in FIGURE 14, hereto, offers the promise of a low Miller feedback capacitance and a high drain breakdown potential. Nevertheless, in addition to the unmodulated portion of the channel, the structure is not altogether satisfactory for the following reasons. In the first place, the half-gate arrangement is restricted to the use of a channel of N-type conductivity. Secondly, it is difficult to fabricate the conducting channel to given specifications since the gate can only be extended to a point midway between the source and drain regions. Thirdly, the portion of the channel not covered by the gate contributes an undesirable series resistance. And finally, the drain series resistance is increased becaue of the tendency of positive charges in the gate insulation material which is not covered by the gate itself to migrate, particularly under the effect of relatively high heat and electric fields. Such migration is usually away from the insulator-semiconductor interfaces.

It is, therefore, an object of the present invention to provide an improved field effect device.

A further object of the invention is to provide an improved field effect transistor of the insulated gate type characterized by high drain breakdown potential which can be optimized.

Another object of the invention is to provied an improved field effect transistor of the insulated gate type and characterized by low Miller feedback capacitance and high drain breakdown potential.

Still another object of the invention is to provide an improved field effect transistor having a source-drain channel effectively controlled by an insulated gate structure.

These and other objects and advantages of the invention are realized in a field effect transistor structure employing two insulated gate or control electrodes. The first gate (hereinafter referred to as "gate #1," or "G1") is disposed over a portion of the channel region between the source and drain and is electrically insulated therefrom. The second gate (hereinafter referred to as "gate #2" or "G2") is disposed over gate #1 a swell as completely over the channel region. Gate #2 is also electrically insulated from gate #1. In other words gate #2 overlaps gate #1 and covers the entire channel region between the source and drain regions. In general, gate #1 covers only the source side of the chanel region. Gate #2 acts to create a conducting surface channel between the source and the drain where gate #1 does not cover the channel therebetween. With a field effect transistor according to the invention a drain breakdown potential of 180 volts, for example, is obtained in comparison with breakdown potentials of 40 to 60 volts characteristic of previous insulated gate field effect transistors.

The invention will be described in greater detail by reference to the drawings in which:

FIGURE 1 is a plan view of a field effect device according to the invention at an initial step in the manufacture thereof;

FIGURE 2 is a cross-sectional elevational view of the device shown is FIGURE 1 taken along the line 2—2 thereof;

FIGURE 3 is a cross-sectional elevational view of the device shown in FIGURE 2 at a further stage in fabrication thereof;

FIGURE 4 is a plan view of the device shown in FIGURE 3 at still another stage in the fabrication thereof;

FIGURE 5 is a cross-sectional elevational view of the device shown in FIGURE 4 taken along the line 5—5 thereof;

FIGURE 6 is a plan view of the device shown in FIGURE 5 at a further stage in the fabrication of;

FIGURE 7 is a cross-sectional elevational view of the device shown in FIGURE 6 taken along the line 7—7 thereof;

Referring now to FIGURES 1 through 10, the fabrication of a field effect transistor device as shown will be described. While the present invention is concerned primarily with the gate electrode arrangement the fabrication of a complete field effect transistor will be described. Thus, in the following paragraphs the steps necessary to form the source and drain regions, the two gate structures, the insulation for the gates, and the necessary electrical contacts to the source, drain, and gates will be explained. It should also be understood that while the fabrication of a single is described, in practice a large number of identical devices on a common semi-conductor may be formed simultaneously and subsequently separated therefrom to yield discrete devices.

Figures 1, 2, 3, 4, 5, 6, 7:
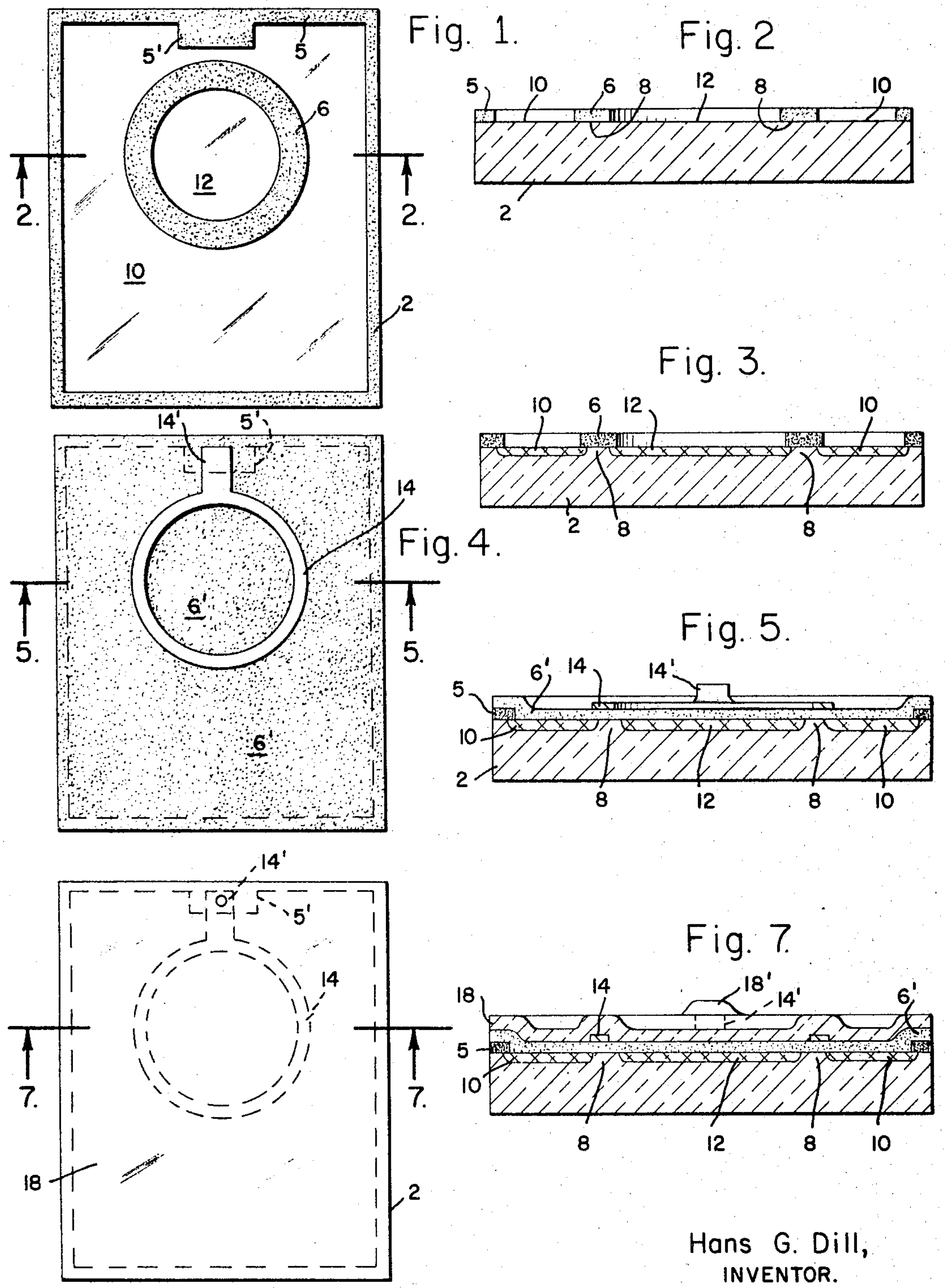

FIGURES 1 and 2 show a semi-conductor body 2 which may be of N-type silicon, for example, having a typical resistivity of about 10 ohm-centimeters. A surface of the semi-conductor body 2 is provided initially with an overall masking layer 4 whose primary function is to prevent the penetration therethrough and into the semi-conductor body any unwanted impurities and especially those which affect the conductivity type of the semi-conductor body. A suitable material for this purpose is silicon dioxide which may be formed by heating the silicon semi-conductor body 2 in an oxidizing atmosphere. Typically such a masking layer may be provided by heating the silicon body 2 to about 1150° C. in steam until a layer of silicon dioxide about 0.6 to 0.8 micron thick is obtained. Thereafter by known resist masking and etching techniques portions of the oxide layer 4 are removed so as to expose surfaces of the silicon body 2 as shown in FIGURES 1 and 2. Specifically an oxide peripheral portion 5 and a tab-like portion 5′ connected thereto of oxide as well as an oxide annular portion 6 remain on the surface. The width of the annular mask portion 6 may be such as to eventually provide an N-type region 8 thereunder of about 12 microns, for example, hereinafter called the channel region which separates the source and drain of the device, indicated by reference numerals 10 and 12 in the FIGURES 1 and 2 though it will be understood the source and drain are not yet formed at this point in the process.

The next step is to form the source and drain regions 10 and 12 by diffusing a P-type impurity into the silicon body 2 from the exposed surfaces of the body. Such diffusion processing is well known in the art and need not be extensively described herein. This step is carried out by exposing the masked and unmasked surface of the silicon body to the vapor of a P-type impurity such as boron, for example, while maintaining the silicon body 2 at a temperature of about 1100° C. Atoms of the impurity penetrate the silicon body at the exposed surfaces thereof and covert the conductivity type of these surface and near surface portions to P-type while having the oxide-protected portions of the silicon body unaffected. Thus, as shown in FIGURE 3, P-type source and drain regions 10 and 12 are formed in the silicon body 2 and separated from each other by the N-type channel region 8 which remains after the diffusion operation and unaffected thereby.

After formation of the source and drain regions 10 and 12, the silicon oxide masking ring 6 is removed leaving only the peripheral and tab-like portion 5, 5′ remaining on the surface. Insulation for the first gate electrode 14 is then formed by completely covering the entire surface of the silicon body 2 with a new layer 6′ of oxide as shown in FIGURES 4 and 5. This oxide layer 6′ will thus cover the channel, source, and drain regions 8, 10, and 12, respectively, as well as the initial peripheral and tab-like oxide regions 5, 5′. This gate insulation layer 6′ of the oxide is very thin and may be from 0.1 to 0.2 micron thick. The oxide layer 6′ may be provided by heating the silicon body 2 to a temperature of about 1025° C. in steam, for example.

Referring now to FIGURES 4 and 5, by means of a mechanical-like mask plate (not shown) the first gate electrode number 14 is provided by vapor-depositing or otherwise forming an electrically conductive substantially annular layer over the insulating oxide layer 6′ and disposed over the channel region 8 so as to extend from over the source region 10 to point about midway across the channel region 8. Thus, if as stated illustratively above, the channel region 8 is about 12 microns wide, the gate electrode 14 will extend from the source side thereof and over the channel to a distance of about 6 microns. The disposition of the gate electrode member 14 with respect to the channel region 8 may be more clearly seen in FIGURE 12. The gate electrode member 14, while substantially annular, is provided with an integral tab-like portion 14′ which extends outwardly and over the oxide tab-like portion 5′. Since this oxide tab-like portion 5′ has an additional oxide layer thereover, it is relatively thick so that the gate tab portion 14′, as seen in FIGURE 5, extends above the principal plane of the gate electrode member 14. The purpose of the gate tab portion 14' is to provide a convenient electrical contact for the gate member itself. The gate electrode member 14 and its tab portion 14' may be formed by vapor depositing a film of metal such as aluminum, chromium, or gold to a thickness of about 1000 to 4000 A. over the entire oxide layer 6'. The ring gate electrode 14 and its tab 14' are then formed by masking the metal and removing the same from unwanted areas by etching.

With reference now to FIGURES 6 and 7, the next step is to provide the electrical insulation for a second gate electrode member 16. This is achieved by completely covering the surface of the silicon body 2 including the gate electrode member 14 and its tab 14' with a layer 18 of silicon oxide which is much thicker than the oxide insulation layer 6' for gate #1. Such an oxide layer may be about one micron, for example. Inasmuch as it is necessary to avoid damaging gate #1 as by the use of high temperatures, it is preferred to form the insulation layer 18 by relatively low temperature techniques. Thus, the insulation layer 18 may be provided by vapor-depositing or sputtering glass or silicon oxide onto the surface of the silicon body 2. The insulation layer 18 will also cover the gate #1 contact tab 14' and is shown thereover as 18' in FIGURE 7. Illustratively, the insulation layer 18 may be formed by the pyrolytic decomposition of tetraethylmethoxy silone with the resulting silicon oxide being tenaciously deposited on the surface of the device as described.

Figure 8:
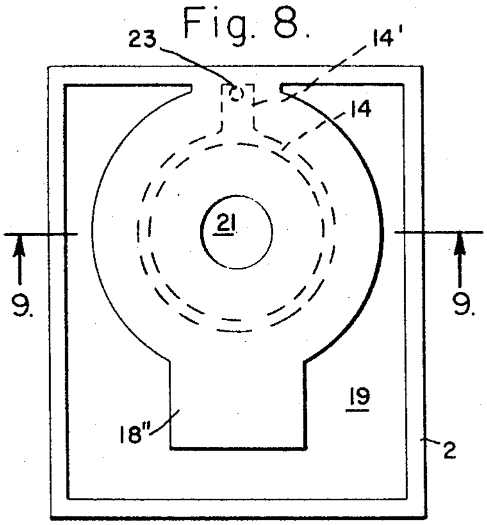
FIGURE 8 is a plan view of the device shown in FIGURES 6 and 7 at a further stage in the fabrication thereof.
Figure 9:
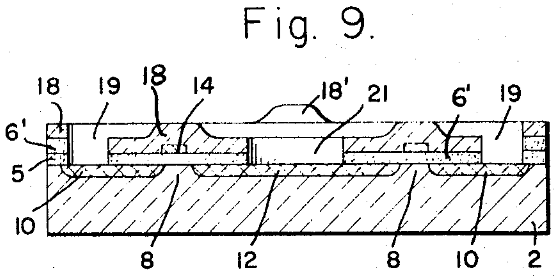
FIGURE 9 is a cross-sectional elevational view of the device shown in FIGURE 8 taken along the line 9—9 thereof.

By conventional resist-making and etching procedures portions of both the insulation layers 6' and 18 are removed to expose corresponding surface portions of the source and drain regions 10 and 12, respectively, as shown in FIGURES 8 and 9. The exposed surface portions are identified by reference numerals 19 and 21 in these figures. It will be understood that the insulation remains on the surface except at these portions. It will be noted that the insulation remaining is generally in the form of an annulus leaving (1) an open central section 21 which is the exposed surface of the drain region 12, and (2) a tab-like portion 18'' which extends in a direction opposite to the direction of the gate #1 tab 14'. It may also be desirable to remove a small area of the insulation layer so as to expose a portion of the gate #1 tab 14' which exposed portion is identified by reference numeral 23 in FIGURE 8. This opening permits making an electrical connection to the gate #1 connection tab 14'.

Figure 10:
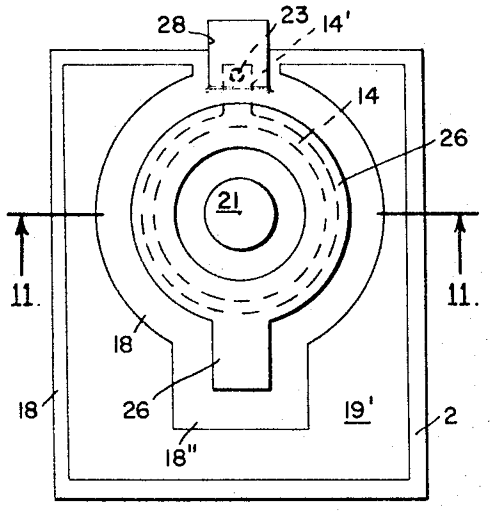
FIGURE 10 is a plan view of the device shown in FIGURE 9 after the completion of the fabrication thereof.
Figure 11:
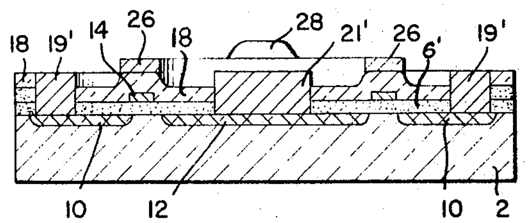
FIGURE 11 is a cross-sectional elevational view of the completed device shown in FIGURE 10 taken along the line 11—11 thereof.

With reference now to FIGURES 10 and 11, a layer of metal such as aluminum is vapor deposited over the entire surface of the device and specifically over the insulation layer 18, 18' as well as over the exposed source, drain, and gate #1 tab surfaces 19, 21, and 23, respectively. The thickness of this metal layer may typically be about 4000 A. Thereafter by the aforementioned resist-masking and etch procedures portions of the metal layer are removed so as to leave a metal annulus 26 disposed over gate #1 and covering completely the channel region 8. The annulus 26, which may now be referred to as gate #2, is also provided with a connection tab portion 26' which overlies the tab-like insulation portion 18''. In addition a relatively large metallic connection member 28 remains over the gate #1 tab 14' and extends down into the opening 23 provided in the insulation layers to contact the gate #1 connection tab 14'. The deposited metal is also left on the exposed portions of the source and drain electrode regions 10 and 12 to permit easy electrical connections to be made thereto. Thus electrical connections may be made to the device of the invention by means of the metal layer 19' (source connection), the metal portion 21' (drain connection), the metal tab 26' (gate #2 connection), and the metal tab 28 (gate #1 connection via metal tab 14') with all connections to the device being provided on the same surface of the device.

Figure 12:
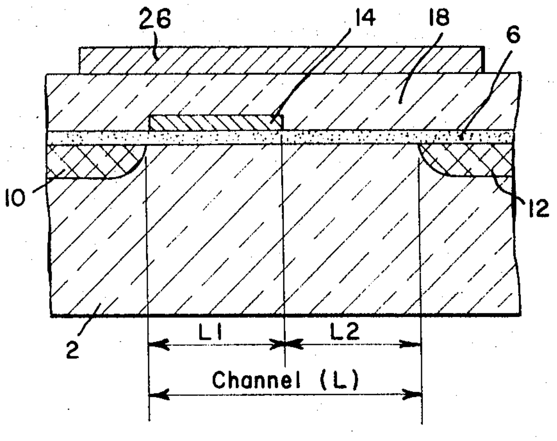
FIGURE 12 is an enlarged cross-sectional view in elevation of a portion of the device shown in FIGURE 11 illustrating in detail the relationships of the channel region and the overlapping gates according to the invention.

With particular reference now to FIGURE 12, it will be appreciated that as shown in this figure a device has been provided wherein a first gate electrode member 14 extends only partly across the channel region 8 between the source electrode 10 and the drain electrode 12 and a second gate electrode member 26 extends completely across the channel region 8. As shown and described both gate #1 and gate #2 are electrically insulated from each other and from the source, drain, and channel regions in the semiconductor body 2. It is generally preferable, but not absolutely necessary, to make the insulation between gate #1 and gate #2 thicker than the insulation between gate #1 and the semiconductor body, in order to avoid or reduce capacitance effects by gate #2 and the other electrode members as well as to avoid breakdown at low drain potentials.

Figures 13, 14:
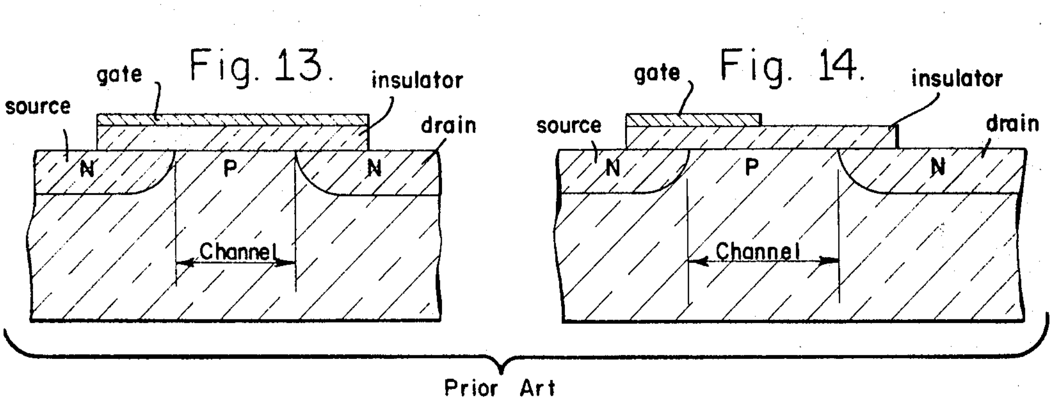
Fig. 13. Fig. 14. Prior Art
FIGURE 13 is an enlarged cross-sectional view in elevation of a portion of a field effect device according to the prior art.
FIGURE 14 is an enlarged cross-sectional view in elevation of a portion of another field effect device according to the prior art.

Since half-gate prior art devices of the type described and shown in FIGURE 14 depend upon rather unreliable surface charges for operation, the major function of the overall gate electrode #2 in a device according to the invention is to create a conducting surface layer where half-gate #1 does not cover the channel region 8 between the source and drain electrode members. This makes it possible to fabricate a field effect device having either a P-type or N-type channel whereas the helf-gate devices of the prior art are limited to operating only with N-type channel regions. Secondly, the conductance of the channel region in devices according to the invention may be adjusted to any desired value by appropriately biasing gate #2.

Another significant advantage possessed by devices according to the invention is that the strength of the channel, L2, not covered by gate #1 may be adjusted by the gate #2 potential up to the point where the breakdown potential of the gate insulation layer is reached. This permits the drain breakdown potential to be optimized as desired and at the same time reduces the resistance of the uncovered channel, L2, thus improving the frequency response.

By grounding gate #2 A.C.-wise, stray fields between gate #1 and the conducting channel, L2, not covered by gate #1 but under gate #2, are limited so that the devices of the invention are characterized by an even lower gate-drain capacitance than that of the prior art half-gate devices.

Another feature of the devices of the invention is a reduction in instability due to migration of positive charges in the gate insulation where the drain potential ($V_D$) is lower than breakdown and the gate #2 field dominates the field from these positive charges. This is found to be especially true if the potential of gate #2 ($V_{G2}$) is greater than $V_D$, and indicates that the channel, L2, under gate #2 is not being pinched-off or terminated at the drain side of the channel region. In other words the electric field from gate #2 assures a considerably more stable channel, L2, than possible with surface charges alone.

There thus has been described a novel insulated-gate field-effect transistor device whose high drain breakdown potential makes it especially useful as a power amplifier. Devices according to the present invention have been built with a useful drain voltage range of up to 200 volts, and it appears that the only ultimate limit for the drain breakdown potential is the bulk breakdown of the drain function itself. In addition, Miller feedback capacitance which is important for the high frequency stability of any amplifier is very low in devices according to the invention and even approaches values familiar with vacuum tube pentodes.

What is claimed is:

1. A field-effect transistor device comprising a semiconductor body having spaced source and drain regions disposed at a common surface thereof, a first gate electrode extending from said source region partially over and electrically insulated from the surface of said semi-conductor body between said source and drain regions, and a second gate electrode extending at least entirely over the surface of said semi-conductor body between said source and drain regions and electrically insulated therefrom and from said first gate electrode.

2. A field-effect transistor device according to claim 1 wherein said first gate electrode extends from said source region to about halfway toward said drain region.

3. A field-effect transistor device comprising a semiconductor body of a first conductivity type and having spaced source and drain regions of opposite conductivity type disposed at a common surface thereof, first electrical insulating means covering at least the surface of said semi-conductor body between said source and drain regions, a first gate electrode disposed on said first electrical insulating means and extending partially thereover from said source region, second electrical insulating means covering at least said first gate electrode, and a second gate electrode disposed over said second electrical insulating means and extending at least entirely over the space between said source and drain regions.

4. A field-effect transistor device according to claim 3 wherein said semi-conductor body is of P-type conductivity and said source and drain regions are of N-type conductivity.

5. A field-effect transistor device according to claim 3 wherein said semi-conductor body is of N-type conductivity and said source and drain regions are of P-type conductivity.

6. A field-effect transistor device comprising a semiconductor body of a first type of conductivity, a diffused source region of opposite conductivity to said first type disposed in said semi-conductor body, a diffused drain region of opposite conductivity to said first type disposed in said semi-conductor and spaced from said source region, a first layer of electrically insulating material disposed over said source and drain regions and over the surface of said semi-conductor body therebetween, a gate electrode disposed on said first layer of electrically insulating material and extending from said source region partially over the surface of said semi-conductor body between said soure and drain regions, a second layer of electrically insulating material disposed over said first gate electrode and at least over said surface of said semiconductor body between said source and drain electrodes, and a second gate electrode disposed on said second layer of electrically insulating material and extending over said first gate electrode and the remainder of said surface of said semi-conductor body between said source and drain electrodes.

7. A field-effect transistor device according to claim 6 wherein said semi-conductor body is silicon and said layers of electrically insulating material are silicon oxide.

8. A field-effect transistor device according to claim 6 wherein said second layer of electrically insulating material is substantially thicker than said first layer of electrically insulating material.

References Cited

UNITED STATES PATENTS

| | | | |
|---|---|---|---|
| 3,333,168 | 7/1967 | Hofstein | 317—235 |
| 3,339,128 | 8/1967 | Olmstead et al. | 317—235 |

JAMES D. KALLAM, *Primary Examiner.*

U.S. Cl. X.R.

317—234